US009059670B2

(12) United States Patent
Yamkovoy

(10) Patent No.: US 9,059,670 B2
(45) Date of Patent: Jun. 16, 2015

(54) AUDIO SIGNAL LEVEL CONTROL SYSTEM

(71) Applicant: Paul G. Yamkovoy, Berlin, MA (US)

(72) Inventor: Paul G. Yamkovoy, Berlin, MA (US)

(73) Assignee: Bose Corporation, Framingham, MA (US)

(*) Notice: Subject to any disclaimer, the term of this patent is extended or adjusted under 35 U.S.C. 154(b) by 350 days.

(21) Appl. No.: 13/624,056

(22) Filed: Sep. 21, 2012

(65) Prior Publication Data

US 2014/0086427 A1    Mar. 27, 2014

(51) Int. Cl.
*H04R 1/10* (2006.01)
*H03G 1/00* (2006.01)
*H03G 3/30* (2006.01)

(52) U.S. Cl.
CPC .......... *H03G 1/0088* (2013.01); *H03G 3/3026* (2013.01)

(58) Field of Classification Search
None
See application file for complete search history.

(56) References Cited

U.S. PATENT DOCUMENTS

| | | | |
|---|---|---|---|
| 4,413,260 A | 11/1983 | Siegel | |
| 5,659,621 A * | 8/1997 | Newton | 381/312 |
| 6,453,042 B1 * | 9/2002 | Roach et al. | 379/395 |
| 7,283,635 B1 * | 10/2007 | Anderson et al. | 381/74 |
| 7,761,091 B2 * | 7/2010 | Dunn et al. | 455/419 |
| 2002/0003889 A1 * | 1/2002 | Fischer | 381/370 |
| 2004/0151336 A1 * | 8/2004 | Han et al. | 381/370 |
| 2004/0240272 A1 * | 12/2004 | Ng et al. | 365/185.33 |
| 2007/0142942 A1 * | 6/2007 | Hyatt | 700/94 |
| 2010/0180754 A1 * | 7/2010 | Brown et al. | 84/610 |
| 2011/0009058 A1 * | 1/2011 | Ha et al. | 455/41.1 |
| 2013/0148819 A1 * | 6/2013 | You et al. | 381/74 |
| 2013/0259241 A1 * | 10/2013 | Schul et al. | 381/56 |

FOREIGN PATENT DOCUMENTS

| | | | | |
|---|---|---|---|---|
| JP | H11 136789 A | | 5/1999 | |
| JP | 2000261264 A | * | 9/2000 | ............... H03G 3/02 |
| JP | 2000 287289 A | | 10/2000 | |
| JP | 2000287289 A | * | 10/2000 | ............... H04R 1/10 |
| JP | 2006352250 A | * | 12/2006 | |
| WO | 2007/103951 A2 | | 9/2007 | |

OTHER PUBLICATIONS

International Search Report issued in corresponding PCT Application No. PCT/US2013/060117 mailed on Feb. 24, 2014.
Written Opinion of the International Searching Authority issued in corresponding PCT Application No. PCT/US2013/060117 mailed on Feb. 24, 2014.

* cited by examiner

*Primary Examiner* — Brenda Bernardi
(74) *Attorney, Agent, or Firm* — Brian M. Dingman; Dingman, McInnes & McLane, LLP

(57) ABSTRACT

An audio source level control system in which the level of the audio source signal that is to be played over headphones is automatically set to an appropriate level. The system can include circuitry that can be controlled so as to increase or decrease the level of the audio signal that is provided by an audio source to the headphones; the audio source is typically a portable consumer digital device. There is a controller that is responsive to the audio signal from the audio source and that is adapted to control the circuitry so as to automatically establish a level of the audio signal that is provided to the headphones when the audio source is initially available to output an audio signal to the headphones.

23 Claims, 3 Drawing Sheets

AUDIO SIGNAL LEVEL CONTROL SYSTEM

FIELD

This disclosure relates to the control of headphone audio level.

BACKGROUND

Headphones can include a loudspeaker for only one ear, or for both ears. The loudspeakers can sit outside the ear or in the ear. Some headphones include additional features such as built-in microphones so that they can be used as headsets.

Users desire to control the level of audio played by the headphones. When the user shuts the audio source off and then restarts it, or connects the headphones to a different source, the initial audio level may be incorrect for the user. This can cause the user to have to change the audio level each time the headphones are used. In extreme circumstances the initial audio level could be so high as to have the potential of physically harming the user.

SUMMARY

In general, in one aspect the level of the audio source signal that is to be played over headphones that are adapted to be worn by a user can be automatically set to an appropriate level by the subject audio source level control system. The audio source is typically a portable consumer digital device, non-limiting examples of which include the iPod®, mp3 players, and smart-phones. The audio signal level control system can include electronic volume-control devices such as digital switches and/or digital potentiometers or the like that can be controlled so as to increase or decrease the level of the audio signal that is provided to the headphones. There is also a controller that is responsive to the source audio signal and that is adapted to control the electronic volume-control devices. The controller can use the volume-control devices to automatically establish a level of the audio signal that is provided to the headphones when the audio source is available to provide an audio signal to the headphones.

Implementations may include one or more of the following aspects. The controller can store information related to the level of the audio signal provided by the audio source. This stored information can be the signal level when the audio source was last disabled from outputting an audio signal that was provided to the headphones, e.g., when the audio source was last turned off or disconnected, or its function switched from audio output to a different function as is often the case with phones or other multi-function portable digital devices. Then, when the audio source is again available to output an audio signal that is to be provided to the headphones, the controller can establish the signal level based on the stored level. For example, the audio level on startup can be set to be at or below the audio level when the source was last disabled. As another example, the level can be set below the last level (e.g., set to zero) and then increased up to the last level. The increase can be a ramp function from zero to the last preset; this can take place quickly so that the ramp is hardly noticeable to the user, or it can be an intentionally slow ramp that results in a "soft start" of the audio.

In one case where the audio signal that is provided by the audio source has a variable level that is defined by a series of discrete steps, the stored information may be the audio signal level step when the audio source was last disabled. Then on startup the controller can establish the initial audio level to be either at, or one or more steps below, the stored step level. The controller can then as necessary subsequently increase the audio level step-by-step until it reaches the stored step.

Additional implementations may include the storage of the audio signal levels over a time period that precedes the time that the audio source was last disabled, rather than storage of only the last audio signal level. This can allow the system to monitor the audio level over time and make an informed decision as to an appropriate audio level at startup. This feature can be useful in situations in which the user had turned the source off shortly after reducing the volume. The system may include an audio signal level detector that determines the level of the audio signal that is provided by the audio source and then provides this determined signal level for storage by the controller. The audio signal level detector may include an envelope detector that determines an envelope comprising amplitude variations of the audio signal, and may further include circuitry that determines a running average of the envelope, wherein the running average is stored by the controller.

The system may be used with pre-existing controls such as user-operated volume-control devices, which may be push-button switches, that are wired in parallel with the electronic switches. The controller can be responsive to these user-operated volume control devices. One manner of such responsiveness allows the user to control the level of the audio signal provided to the headphones (e.g., the balance) via manipulation of the volume-control devices. The system may also include left and right potentiometers in the path of the audio signal, and the controller can be adapted to control the potentiometers so as to establish an audio signal level.

In another aspect the disclosure includes a system for remotely controlling the level of the audio signal that is provided by an audio source to headphones that are adapted to be worn by a user. This system includes a first electronic switch that is operable to cause a decrease of the level of the audio signal that is provided to the headphones and a second electronic switch that is operable to cause an increase of the level of the audio signal that is provided to the headphones. A controller is responsive to the audio signal that was provided by the audio source and is adapted to control the first and second electronic switches to simulate volume control button presses by the user. The controller uses one or both electronic switches to automatically establish a particular level of the audio signal that is provided to the headphones when the audio source is available to output an audio signal that is to be provided to the headphones. The controller stores the last audio signal level from when the audio source was last disabled from outputting an audio signal that was provided to the headphones. When the audio source is then later available to output an audio signal that is to be provided to the headphones, the controller establishes the initial level of the audio signal provided to the headphones to be below the stored level, and then the controller subsequently quickly and incrementally increases the level until it reaches the stored level.

In another aspect the disclosure includes headphones adapted to be worn by a user and to control the level of an audio signal that is provided by an audio source to the headphones, the headphones comprising a volume up user-operable switch and a volume down user-operable switch, a first digital switch wired in parallel with the volume up switch and that is operable to command the source to increase the level of the audio signal that is provided to the headphones, a second digital switch wired in parallel with the volume down switch and that is operable to command the source to decrease the level of the audio signal that is provided to the headphones, a controller, responsive to the audio signal that was received from the audio source and adapted to control the first and second digital switches, the controller using one or both digital switches to automatically establish a level of the audio signal that is provided to the headphones after detecting that the audio source is available to provide an audio signal to the headphones wherein the controller stores the audio signal level when the headphones were last disconnected from the audio source, and wherein when the audio source is available to provide an audio signal to the headphones, the controller establishes the level of the audio signal provided to the headphones to be below the audio signal level when the headphones were last disconnected from the audio source, and then the controller subsequently increases the level of the audio signal provided to the headphones until it reaches the stored audio signal level.

The audio signal that is provided by the audio source may have a variable level that is defined by a series of discrete steps. The signal level that is stored by the controller may be the audio signal level step when the audio source was last disabled from outputting an audio signal that was provided to the headphones. When the audio source is available to output an audio signal that is to be provided to the headphones, the controller can establish the level of the audio signal that is provided to the headphones to be below the stored audio signal level step. The controller can subsequently increase the level of the audio signal provided to the headphones step-by-step until it reaches the step of the stored audio signal level.

Other features and advantage will become apparent from the following more detailed description and the claims.

DETAILED DESCRIPTION

Users desire headphones to play sound at an appropriate level with minimal need for manual control. When headphones and an audio source are functionally disconnected (e.g., when the audio source is turned off or switched to another function, or the headphones are unplugged from the audio source output), the audio source (and potentially the headphones as well) will have been set at a particular volume. When the headphones are again functionally connected to the audio source, the sound level played over the headphones may be incorrect. For example, if the output signal level of the audio source was changed since it was last used with the particular headphones, the audio may be too loud or too soft. In an extreme case the volume can be high enough to case ear damage. The user must thus pay close attention to volume level each time the headphones and audio source are connected. This is inconvenient.

The audio signal level control system described here monitors the audio level and stores the audio level at the time when the audio source is disabled or otherwise unplugged or disconnected from the headphones. Then, when any audio source is connected to the headphones the system sets the initial volume at a level related to (typically at or below) this stored value. The system can then alter the level to return it to the stored level. In some audio sources the output level is divided into a series of discrete steps, e.g., eight or sixteen steps, in which case the stored level can be the quantity of steps above zero, or the like. In some cases the audio source output signal level can be measured by the subject control system. Some audio sources will have an unknown audio signal level control scheme; in these cases the audio signal level can be measured by the system. The level can then be compared to the stored level in a feedback control system that returns the audio to its past level or sets it at some other level.

The amplitude of audio signals naturally varies quite a bit over time. An instantaneous signal amplitude measurement may thus not represent the actual volume. Accordingly, in cases where the system measures the signal level it is best to have the system average the signal level over some reasonable time period as a means to estimate signal level. A running average of the audio signal envelope can be one means of obtaining such average.

Figure 1:
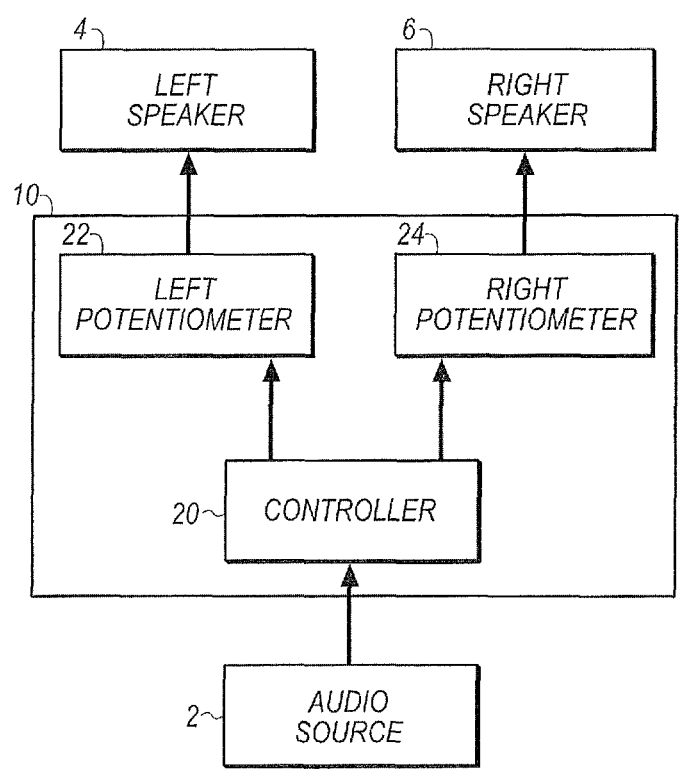
FIG. 1 is a block diagram of a system for remotely controlling the level of the audio signal that is provided by an audio source to headphones.

Headphone volume control system 10, FIG. 1, is adapted to control the level of the audio signal that is provided by audio source 2 to headphones (not shown in detail) that comprise left ear speaker 4 and right ear speaker 6. Such headphones typically include one or more loudspeakers for each ear, but can include a loudspeaker for only one ear. The loudspeakers can be located against the ear or within the ear. The headphones can have other features such as a microphone, which is commonly present in headsets.

System 10 is adapted to automatically establish a level of the audio signals that are used to drive the speakers. System 10 is typically used with an audio source with an unknown signal level control scheme. System 10 accomplishes audio signal level control using a digital controller 20 that receives as an input the audio signal(s) outputted by audio source 2. Preferably both the left and right source signals are used by system 10, but it is sufficient to use only one of them. The source signals can be provided over wires, which are typically part of the headphone cable, or can be provided wirelessly as, for example, a radio frequency signal such as a Bluetooth signal. System 10 sits between the audio source 2 and the headphone loudspeakers and is operable to alter the level of the audio source signal that is played over the headphones. Adjustment of the audio signals is accomplished with electronic volume control devices that are controlled by controller 20 to establish a desired level of the audio signals that are provided to the loudspeakers. In this example these electronic volume control devices comprise left digital potentiometer 22 and right digital potentiometer 24.

System 10 is adapted to be used when the audio source is unknown. Controller 20 senses the audio level from source 2 (e.g., by determining the running average as described elsewhere herein) and stores it. The stored audio level can then be retrieved after source 2 is re-enabled, and used by controller 20 to set the initial volume to where it was before.

Controller 20 is adapted to automatically provide control signals that cause devices 22 and 24 to establish a particular audio signal level. One manner in which this control feature can be used is to establish a particular headphone volume level, for example when the headphones are initially operatively connected to the audio source. This can be accomplished by including digital memory in controller 20 and storing in the memory information that can then be used by the controller to establish this volume level based upon the audio source signal that the controller receives from the audio source.

In one example, controller 20 stores the level of the audio signal at which it existed at the time that the headphones were last operatively disconnected from an audio source, for example, when an audio source was shut off or its function switched from audio to a different function, or when the headphone jack was unplugged from the audio source. Controller 20 can be adapted to continuously measure the audio level, typically as an instantaneous value or a running average, and then store the measured value. The amplitude of audio signals virtually always varies quite a bit over time. An instantaneous measurement of an audio signal amplitude thus is often not an appropriate measure of the actual volume. The signal envelope is a better measure than the instantaneous amplitude. An even better means of measuring amplitude is to average the signal envelope over time: a running envelope average provides a reasonable determination of the actual volume level in cases in which the audio source or its volume control buttons cannot be interrogated or monitored by the controller to determine the volume level. This averaging time can run for seconds, or even tens of seconds in order to account for slowly developing music fragments with a wide dynamic range.

Figure 2:
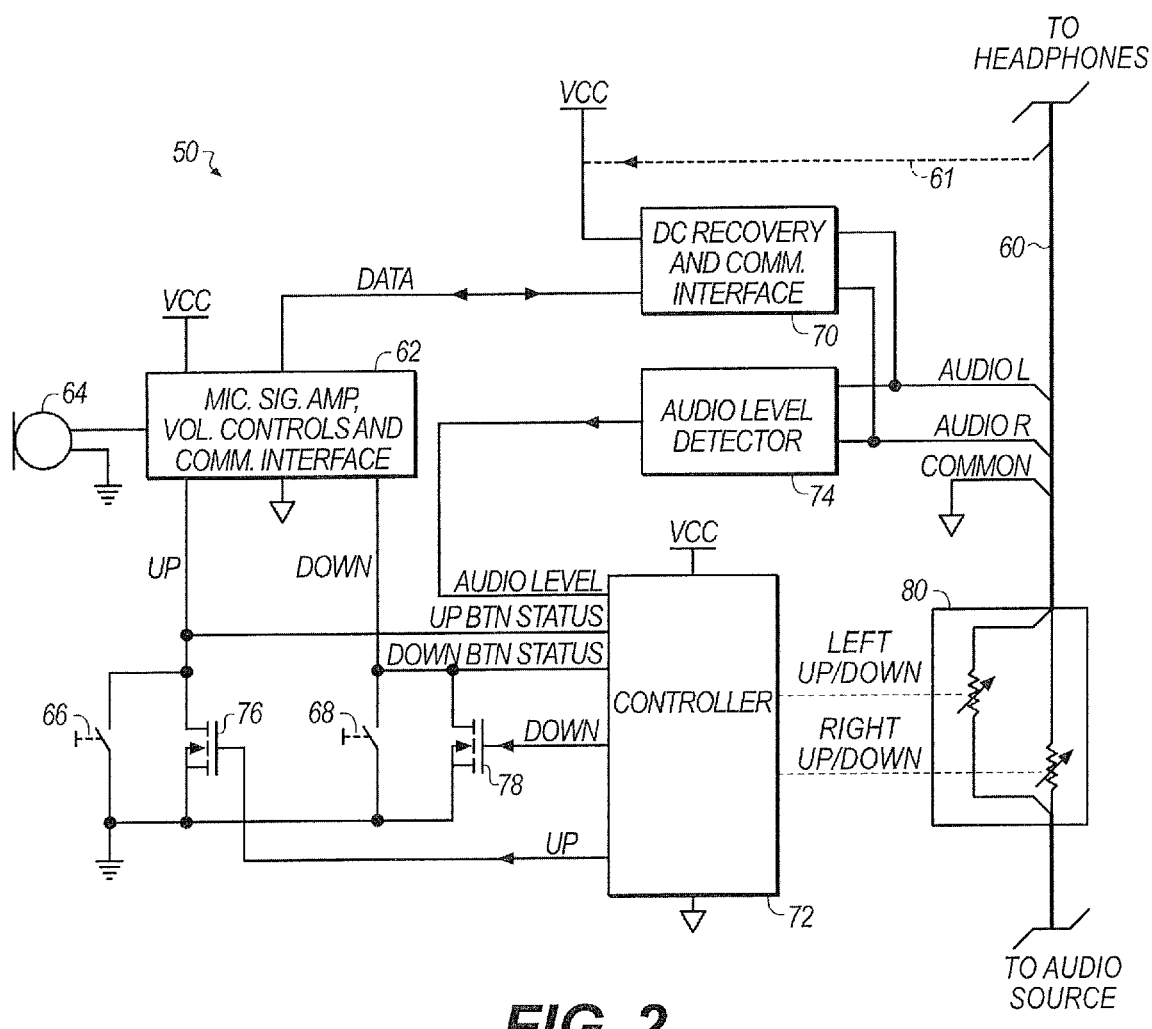
FIG. 2 is a block diagram of a system for remotely controlling the level of the audio signal that is provided by an audio source to headphones.

Headphone volume control system 50, FIG. 2, illustrates an implementation of the subject system that is particularly adapted to be used with a proprietary audio source (e.g., an Apple iPod®) and a headset that is designed for use with the source. The headset comprises headset cord 60, headset microphone 64, microphone signal amplifier volume controls and communication interface chip 62, and user-operable up and down volume control devices 66 and 68. Devices 66 and 68 are momentary pushbutton switches that user pushes to adjust the volume up and down. Each push generates a command that is sent back to the audio source via the same wire as the microphone bias that is received by the headset from the audio source. These commands cause the audio source to increase or decrease the audio signal level. In one example, the volume range is divided into 16 discrete steps, and each button push results in one step change up or down.

System 50 can automatically establish a headphone volume when the source is enabled. For example, when the source is turned on system 50 can return the volume to its last-used or previous level. This can occur when the audio source is powered up or is switched to audio, for example. One non-limiting manner of accomplishing this initial volume level is as follows. Controller 72 monitors the level of the audio source signal and stores this signal level on a running basis in its non-volatile memory. When the source is functionally disconnected from the headphones, the memory retains the last source output signal level, and potentially a history over time of the signal level for some time frame before the source was disabled. In one example, at power-up the level of the signal sent to the headphones is set to zero, and then when the source is enabled (turned on) as indicated by the presence of the microphone bias signal the audio signal level is increased to the pre-determined (stored) level. The increase can take place in a ramped fashion rather than as a single step so that the user is less likely to be jarred by an immediate jump to a loud signal. When the communication between system 50 and the audio source allows for a priori knowledge of the current audio source signal level, the set point and the ramp can be accomplished without any measurement of the audio level.

Power to operate system 50 is typically derived via DC recovery and communication interface circuit 70 that is input with the microphone bias signals from the audio source. Device 70 extracts from the microphone bias signal of the audio source DC power and data signals and provides the extracted data to device 62 and controller 72. If the headset includes its own battery, the power can instead be derived from this battery via optional line 61.

Headsets that are compatible with iPods include a proprietary digital device (chip) 62 that handles the output of microphone 64 and interfaces with user-operable up and down volume-control pushbuttons 66 and 68 that are part of the headset. One example of an automatic volume control regimen of the present disclosure is accomplished with added microcontroller 72, and added volume control devices 76 and 78 that are wired in parallel with pushbuttons 66 and 68. Devices 76 and 78 are controlled via controller 72 to set the audio source volume at a desired level. Audio level detector 74 and volume control 80 are optional. System 50 can communicate back to the audio source to cause the source to change its output signal level as a means to adjust the volume up or down. The system communicates back by manipulating the existing volume up/down switches 66 and 68, like a user would.

Controller 72 memorizes the number of user pushbutton "up/down" clicks and determines/stores this step count. As one non-limiting example (with an audio source device such as an iPod that has a sixteen-step volume range): for the very first time that the source is used with the headphones (before the step value has been stored in controller 72) controller 72 will command the iPod to set the volume at the middle of its range. Controller 72 does this by issuing sixteen "step down" commands, each such command accomplished by momentarily shorting the "volume down" pushbutton switch 68 using MOSFET transistor 78. At this point controller 72 knows that the volume step count is at "0." Then controller 72 issues eight "volume up" commands by momentarily shorting the "volume up" pushbutton switch 66 eight times, using MOSFET transistor 76. At this point the volume is set at half scale. From then on controller 72 will count all increments/decrements by the user (by monitoring the states of inputs "Up_Btn_Status" and "Down_Btn_Status") and store the current value in non-volatile memory. After disabling and re-enabling of the audio source (by the user), controller 72 will read its last stored volume step value and set the source to this level by stepping down sixteen steps and then up the correct number of steps to reach this stored volume.

System 50 can be programmed to allow additional user interface commands (other than volume control) via appropriate manipulation of buttons 66 and 68. For example, when both the left and right audio signals are input to system 50, controller 72 can be used to accomplish left-right balance control via signaling by appropriate manipulation of buttons 66 and 68. As one non-limiting example, depressing both buttons simultaneously could signal controller 72 to allow the user to adjust the balance via subsequent pushes of buttons 66 or 68, one to control the left channel and the other to control the right channel.

When the audio source device is unknown (e.g., the signal level control scheme used by the source is not known), system 50 uses audio level detector 74 to determine the audio signal level, which is then provided to and stored by controller 72. Controller 72 can then increase or decrease the volume via control of devices 76 and 78, and/or the potentiometers in control 80. The increase can be in small increments (e.g., 1-2 dB each) in a feedback system in which the level is continuously measured and increased until the final level is reached. The slope (linear rate of rise from low to high) may vary from fractions of a second to several seconds. It may also be advantageous to increase the volume in a non-linear fashion (such as exponential or parabolic) to allow for a smoother perceived transition from low to high volumes.

The potentiometers in volume control 80 can be used to set the level of the audio signals sent to the headphones for an audio source that is not adapted to be controlled by buttons 66 and 68. In this case, instead of issuing digital commands and sending them to the source via the microphone wire, controller 72 will issue commands "Left/Right" and "Up/Down" to volume control 80, and control the headset volume via adjustment of its potentiometers that directly adjust the audio signals that were sent out by the audio source. Volume control 80 can be used to set the initial audio level in the manner described above, and/or can be used to set the audio level at other times during use of the audio source.

Volume control 80 can also be used to allow the user to adjust the audio balance. Balance adjustment could be beneficial for users with partial hearing loss in one ear who would require greater volume to compensate for it. Balance adjustment can be done once, for example, during the headset's initial setup and stored in non-volatile memory of controller 72. Pressing buttons in some non-typical order (e.g., two buttons together for some pre-determined period of time) will put controller 72 in "initial setup mode," allowing for setting up and storing of the balance.

Figure 3:
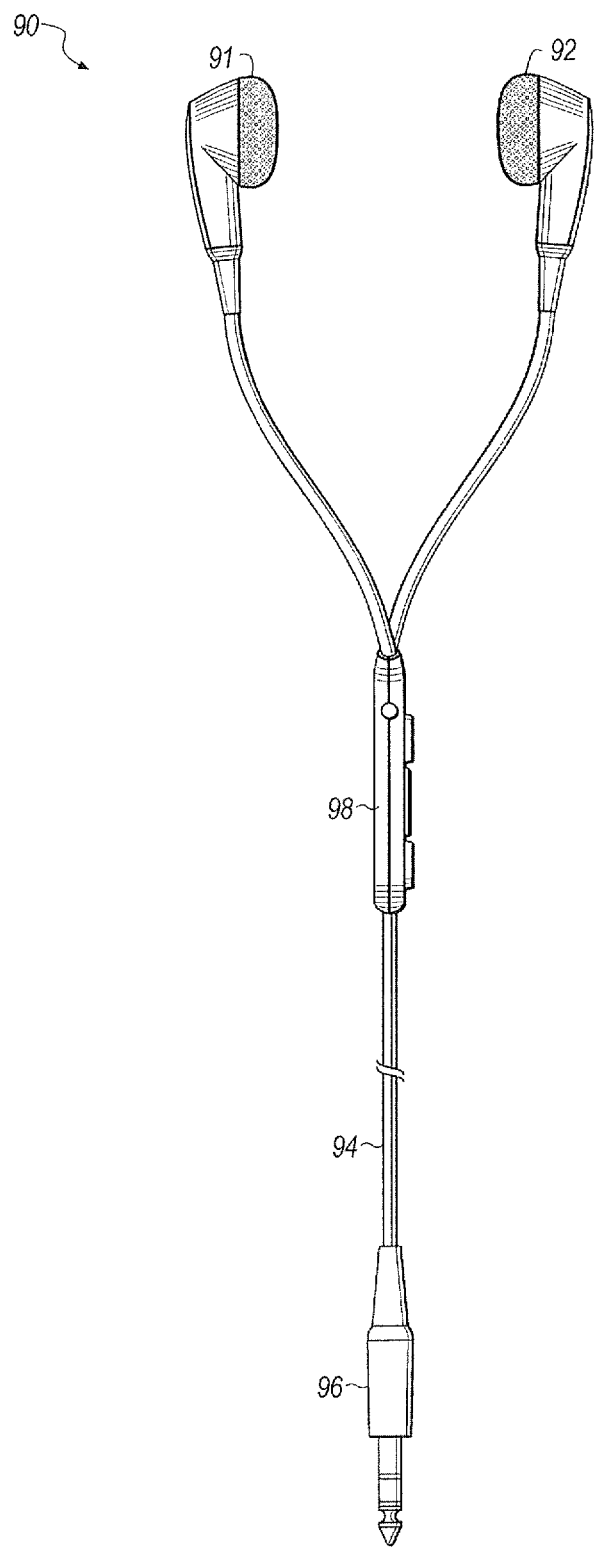
FIG. 3 illustrates an example of where the subject system can be physically located.

Headset 90, FIG. 3, is an example of one non-limiting physical location of the present system. Headset 90 comprises headphones with left and right speakers 91 and 92 and headset cable 94 that terminates in jack 96 that is adapted to interface with an audio source device. Housing 98 located on cable 94 comprises user-operated push buttons such as volume control buttons 66 and 68, FIG. 2. The hardware that defines all of system 50 can be located in housing 98.

The present system may set the volume to levels other than the last level, for example it could be set to a predetermined level such as half or one-third scale. This could be done for a desired reason, e.g., so as to prevent the user from blasting loud music in quite environments: people subconsciously increase volume to compensate for loud environments (to achieve a comfortable signal to noise ratio). If the source was disabled while in this state, on the next startup it could be too loud and so setting an artificial limit may be advantageous.

As another option, the signal level can be measured (and represented) in several ways but always in conjunction with the time constants: e.g., RMS value (root mean square), zero-to peak value, peak-to-peak value, etc. Another method to determine the signal level would be to read (periodically sample) the audio signal values into the controller, followed by calculations of the level via a predetermined algorithm.

Other features and advantages will occur to those skilled in the art and are within the scope of the claims.

What is claimed is:

1. A system for controlling the level of the audio signal that is provided by an audio source to headphones that are adapted to be worn by a user, the system comprising:
    circuitry that is operable to increase and decrease the level of the audio signal that is provided to the headphones, wherein the circuitry comprises first and second digital switches; and
    a controller, responsive to the audio signal provided by the audio source and adapted to control the circuitry that is operable to increase and decrease the level of the audio signal that is provided to the headphones, the controller automatically establishing a level of the audio signal that is provided to the headphones when the audio source is available to output an audio signal to the headphones;
    wherein the headphones comprise user-operated volume-control devices wired in parallel with the first and second digital switches, wherein the controller is further responsive to the user-operated volume control devices, to allow the user to control the balance or the audio signal provided to the headphones via manipulation of the volume-control devices.

2. The system of claim 1 wherein the circuitry that is operable to increase and decrease the level of the audio signal that is provided to the headphones comprises first and second digital potentiometers.

3. The system of claim 1 wherein the controller stores information related to the level of the audio signal provided to the headphones.

4. The system of claim 3 wherein the stored information related to the level of the audio signal provided to the headphones comprises the signal level when the audio source was last disabled from outputting an audio signal that was provided to the headphones.

5. The system of claim 4 wherein when the audio source is available to output an audio signal that is to be provided to the headphones, the controller establishes the level of the audio signal that is provided to the headphones based on the stored signal level when the audio source was last disabled from outputting an audio signal that was provided to the headphones.

6. The system of claim 5 wherein when the audio source is available to output an audio signal that is to be provided to the headphones, the controller establishes the level of the audio signal that is provided to the headphones to be equal to the stored signal level when the audio source was last disabled from outputting an audio signal that was provided to the headphones.

7. The system of claim 6 wherein the audio signal that is provided by the audio source has a variable level that is defined by a series of discrete steps.

8. The system of claim 7 wherein the stored information related to the level of the audio signal provided to the headphones comprises the audio signal level step when the audio source was last disabled from outputting an audio signal that was provided to the headphones.

9. The system of claim 8 wherein when the audio source is available to output an audio signal that is to be provided to the headphones, the controller establishes the level of the audio signal that is provided to the headphones to be below the stored audio signal level step when the audio source was last disabled from outputting an audio signal that was provided to the headphones.

10. The system of claim 9 wherein the controller subsequently increases the level of the audio signal provided to the headphones step-by-step until it reaches the step of the stored audio signal level.

11. The system of claim 3 wherein the stored information related to the level of the audio signal provided to the headphones comprises the signal levels over a time period that precedes the time that the audio source was last disabled from outputting an audio signal that was provided to the headphones.

12. The system of claim 3 further comprising an audio signal level detector that determines the level of the audio signal that is provided by the audio source.

13. The system of claim 12 wherein the audio signal level detector provides the determined audio signal level for storage by the controller.

14. The system of claim 13 wherein the audio signal level detector comprises an envelope detector that determines an envelope comprising amplitude variations of the audio signal.

15. The system of claim 14 wherein the audio signal level detector further comprises circuitry that determines a running average of the envelope, wherein the running average is stored by the controller.

16. The system of claim 1 further comprising left and right potentiometers in the path of the audio signals, wherein the controller is adapted to control the potentiometers so as to establish an audio signal level.

17. A system for controlling the level of the audio signal that is provided by an audio source to headphones that are adapted to be worn by a user and that comprise a volume up user-operable switch and a volume down user-operable switch, the system comprising:
   a first digital switch wired in parallel with the volume up switch and that is operable to cause an increase of the level of the audio signal that is provided to the headphones;
   a second digital switch wired in parallel with the volume down switch and that is operable to cause a decrease of the level of the audio signal that is provided to the headphones;
   a controller, responsive to the audio signal that was provided by the audio source and adapted to control the first and second digital switches, the controller using one or both digital switches to automatically establish a level of the audio signal that is provided to the headphones after the audio source is available to output an audio signal that is to be provided to the headphones;
   wherein the controller stores the audio signal level when the audio source was last disabled from outputting an audio signal that was provided to the headphones; and
   wherein when the audio source is available to output an audio signal that is to be provided to the headphones, the controller establishes the initial level of the audio signal provided to the headphones to be below the level when the audio source was last disabled from outputting an audio signal, and then the controller subsequently increases the level of the audio signal provided to the headphones until it reaches the stored audio signal level.

18. The system of claim 17 further comprising left and right potentiometers in the path of the audio signals, wherein the controller is adapted to control the potentiometers so as to establish an audio signal level.

19. Headphones adapted to be worn by a user and to control the level of an audio signal that is provided by an audio source to the headphones, the headphones comprising:
   a volume up user-operable switch and a volume down user-operable switch;
   a first digital switch wired in parallel with the volume up switch and that is operable to command the source to increase the level of the audio signal that is provided to the headphones;
   a second digital switch wired in parallel with the volume down switch and that is operable to command the source to decrease the level of the audio signal that is provided to the headphones;
   a controller, responsive to the audio signal that was received from the audio source and adapted to control the first and second digital switches, the controller using one or both digital switches to automatically establish a level of the audio signal that is provided to the headphones after detecting that the audio source is available to provide an audio signal to the headphones;
   wherein the controller stores the audio signal level when the headphones were last disconnected from the audio source; and
   wherein when the audio source is available to provide an audio signal to the headphones, the controller establishes the level of the audio signal provided to the headphones to be below the audio signal level when the headphones were last disconnected from the audio source, and then the controller subsequently increases the level of the audio signal provided to the headphones until it reaches the stored audio signal level.

20. The headphones of claim 19 wherein the audio signal that is provided by the audio source has a variable level that is defined by a series of discrete steps.

21. The headphones of claim 20 wherein the audio signal level stored by the controller comprises the audio signal level step when the audio source was last disabled from outputting an audio signal that was provided to the headphones.

22. The headphones of claim 21 wherein when the audio source is available to output an audio signal that is to be provided to the headphones, the controller establishes the level of the audio signal that is provided to the headphones to be below the stored audio signal level step.

23. The headphones of claim 22 wherein the controller subsequently increases the level of the audio signal provided to the headphones step-by-step until it reaches the step of the stored audio signal level.

* * * * *